(12) United States Patent
Kayama et al.

(10) Patent No.: US 8,861,196 B2
(45) Date of Patent: Oct. 14, 2014

(54) HEAT DISSIPATION STRUCTURE AND ELECTRONIC APPARATUS

(71) Applicant: Sony Corporation, Tokyo (JP)

(72) Inventors: Shun Kayama, Saitama (JP); Yukiko Shimizu, Saitama (JP)

(73) Assignee: Sony Corporation (JP)

( * ) Notice: Subject to any disclaimer, the term of this patent is extended or adjusted under 35 U.S.C. 154(b) by 184 days.

(21) Appl. No.: 13/646,840

(22) Filed: Oct. 8, 2012

(65) Prior Publication Data

US 2013/0094144 A1    Apr. 18, 2013

(30) Foreign Application Priority Data

Oct. 14, 2011    (JP) ................. 2011-227029

(51) Int. Cl.
*H05K 7/20*    (2006.01)

(52) U.S. Cl.
USPC ............ 361/679.47; 361/679.48; 361/679.49; 361/694; 361/695; 361/760; 174/548; 62/3.3; 454/184

(58) Field of Classification Search
USPC ........... 361/676–678, 679.46–679.54, 361/688–722, 752, 760, 831
See application file for complete search history.

(56) References Cited

U.S. PATENT DOCUMENTS

| | | | |
|---|---|---|---|
| 6,717,808 B2* | 4/2004 | Ueda et al. | 361/695 |
| 6,909,602 B2* | 6/2005 | Dietrich et al. | 361/679.08 |
| 7,248,471 B2* | 7/2007 | Wabiszczewicz | 361/694 |
| 7,403,385 B2* | 7/2008 | Boone et al. | 361/692 |
| 8,248,784 B2* | 8/2012 | Nakamichi et al. | 361/679.5 |
| 8,698,010 B2* | 4/2014 | Sakamoto et al. | 174/547 |
| 2003/0183269 A1* | 10/2003 | Maeda et al. | 136/211 |
| 2009/0262497 A1* | 10/2009 | Beauchamp et al. | 361/679.49 |

FOREIGN PATENT DOCUMENTS

JP    09-126670 A    5/1997

* cited by examiner

*Primary Examiner* — Courtney Smith
(74) *Attorney, Agent, or Firm* — Lerner, David, Littenberg, Krumholz & Mentlik, LLP

(57) ABSTRACT

A heat dissipation structure includes a circuit board that is disposed inside an outer casing having a chassis formed with air inlet holes, and in which a first electronic component generating heat when driven and a second electronic component not generating heat when driven are mounted on one surface of a base plate, and a heat sink that releases the heat generated in the first electronic component. Here, in the heat sink, a heat dissipation unit positioned facing the base plate, an eaves portion protruding from the heat dissipation unit, and a pair of enclosing portions protruding from ends of the eaves portion in a direction perpendicular to a protruding direction from the heat dissipation unit, and at least one of the air inlet holes is formed in a position facing the eaves portion.

11 Claims, 9 Drawing Sheets

HEAT DISSIPATION STRUCTURE AND ELECTRONIC APPARATUS

CROSS-REFERENCE TO RELATED APPLICATION

The present application claims priority from Japanese Patent Application No. JP 2011-227029 filed in the Japanese Patent Office on Oct. 14, 2011, the entire content of which is incorporated herein by reference.

BACKGROUND

The present disclosure relates to the field of technology for a heat dissipation structure and an electronic apparatus. Specifically, the present disclosure relates to technologies for suppressing an increase in a temperature of a second electronic component which does not generate heat when driven without causing an increase in manufacturing costs, by providing an eaves portion in a heat sink for releasing heat generated in a first electronic component.

There are many cases in which a circuit board in which a predetermined wiring pattern is formed inside an outer casing is disposed in a variety of electronic apparatuses such as a recording medium recording and a reproduction apparatus, an audio recording and reproduction apparatus, a cellular phone, an image recording and reproduction apparatus, an imaging apparatus, an information processing apparatus, a network communication apparatus, and the like.

There exists an electronic component having a variety of functions, which is mounted on such a circuit board and generates heat when driven. Since there is a possibility that heat generated in the electronic component adversely affects operation of the electronic apparatus, a heat dissipation structure for suppressing an increase in a temperature of the electronic components due to the generated heat is provided in the electronic apparatus (for example, Japanese Unexamined Patent Application Publication No. 9-126670).

In the electronic apparatus described in Japanese Unexamined Patent Application Publication No. 9-126670, by bringing a heat sink into contact with an electronic component through a heat transfer sheet, the heat generated in the electronic component is released to the outside by the heat sink to thereby suppress an increase in a temperature of the electronic components.

Meanwhile, other than the electronic components which generate heat at the time of driving, electronic components which do not generate heat when driven may be mounted on the circuit board, and therefore there is a possibility that the electronic components which do not generate heat are adversely affected by the heat of the electronic components which generate heat on the circuit board.

For example, when the electronic component which does not generate heat is affected by the heat, there is a possibility that a corresponding electronic component malfunctions, or the service life of the corresponding electronic component becomes shorter.

SUMMARY

However, as the electronic apparatus described in Japanese Unexamined Patent Application Publication No. 9-126670, even if a heat sink is brought into contact with an electronic component that does not generate heat, since heat generation from the electronic component does not occur, the heat sink does not suppress the increase in the temperature of the electronic component. In addition, when the heat sink is brought into contact with the electronic component which does not generate heat, there is a possibility that heat is transmitted, through the heat sink, from the electronic component which generates heat to the electronic component which does not generate heat to thereby promote the increase in the temperature of the electronic component which does not generate heat.

Accordingly, with regard to the electronic component which does not generate heat, a heat dissipation structure that does not use the heat sink is provided separately from a heat dissipation structure that uses a heat sink relating to the electronic component which generates heat, but in this case, a plurality of heat dissipation structures including the heat dissipation structure which uses the heat sink and the heat dissipation structure which does not use the heat sink are provided.

Accordingly, by providing the plurality of heat dissipation structures including the heat dissipation structure which uses the heat sink and the heat dissipation structure which does not use the heat sink, there arise problems that a structure of the electronic apparatus becomes complex and manufacturing costs are increased.

Therefore, it is desirable to provide a heat dissipation structure and an electronic apparatus that suppress an increase in a temperature of a second electronic component that does not generate heat when driven without causing an increase in manufacturing costs.

First, according to an embodiment of the present disclosure, there is provided a heat dissipation structure including: a circuit board that is disposed inside an outer casing having a chassis formed with at least one of air inlet holes for taking in cooling air from the outside, and in which a first electronic component which generates heat when driven and a second electronic component which does not generate heat when driven are mounted on one surface of a base plate; and a heat sink that is disposed on a surface side on which the first electronic component of the circuit board is mounted, and releases the heat generated in the first electronic component, wherein a gap is formed between the heat sink and the second electronic component, in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and at least one of the air inlet holes of the chassis is formed in a position facing the eaves portion.

Accordingly, in the heat dissipation structure, the cooling air flowing from the air inlet hole may be guided to the second electronic component by the eaves portion and the pair of enclosing portions.

Second, in the heat dissipation structure, it is desirable that the chassis be positioned so as to be spaced apart from the base plate while positioned so as to face the base plate, and a leading edge of the eaves portion exist in the same position as a position of the base plate in a thickness direction of the base plate.

The chassis is positioned so as to be spaced apart from the base plate while positioned so as to face the base plate, and the leading edge of the eaves portion exists in the same position as the position of the base plate in the thickness direction of the base plate, and therefore a flow rate of the cooling air flowing-in from the air inlet hole is increased between the heat sink and the circuit board.

Third, in the heat dissipation structure, it is desirable that the chassis be positioned so as to be spaced apart from the base plate while positioned so as to face the base plate, and a leading edge of the eaves portion exists between the base plate and the chassis in a thickness direction of the base plate.

The chassis is positioned so as to be spaced apart from the base plate while positioned so as to face the base plate, and the leading edge of the eaves portion exists between the base plate and the chassis in the thickness direction of the base plate, and therefore a flow rate of the cooling air flowing-in from the air inlet hole is further increased between the heat sink and the circuit board.

Fourth, in the heat dissipation structure, it is desirable that the chassis be positioned so as to be spaced apart from the base plate while positioned so as to face the base plate, and a leading edge of the eaves portion be brought into contact with the chassis.

The chassis is positioned so as to be spaced apart from the base plate while positioned so as to face the base plate, and the leading edge of the eaves portion is brought into contact with the chassis, and therefore a flow rate of the cooling air flowing-in from the air inlet hole is still further increased between the heat sink and the circuit board.

Fifth, in the heat dissipation structure, it is desirable that the pair of enclosing portions be positioned on the outside of the outer periphery of the base plate.

The pair of enclosing portions is positioned on the outside of the outer periphery of the base plate, and therefore the cooling air flowing-in from the air inlet hole is guided to the eaves portion by the pair of enclosing portions.

Sixth, in the heat dissipation structure, it is desirable that a bending angle of the pair of enclosing portions with respect to the eaves portion be less than 90°.

The bending angle of the pair of enclosing portions with respect to the eaves portion is less than 90°, and therefore the cooling air guided to the eaves portion by the pair of enclosing portions is increased.

Seventh, in the heat dissipation structure, it is desirable that a bending angle of the pair of enclosing portions with respect to the eaves portion be 90°.

Since the bending angle of the pair of enclosing portions with respect to the eaves portion is 90°, the cooling air guided to the eaves portion by the pair of enclosing portions is further increased.

Eighth, in the heat dissipation structure, it is desirable that in the heat sink, a protrusion portion that protrudes to the circuit board side and is brought into contact with the first electronic component be provided.

In the heat sink, the protrusion portion that protrudes to the circuit board side and is brought into contact with the first electronic component is provided, and therefore an increase in a temperature of the first electronic component is suppressed, resulting in a reduction in influence of heat of the first electronic component on the second electronic component.

Ninth, in the heat dissipation structure, it is desirable that the chassis be made of a material having favorable thermal conductivity, and the heat sink be brought into contact with the chassis.

The chassis is made of a material having favorable thermal conductivity, and the heat sink is brought into contact with the chassis, and therefore an increase in a temperature of each of the first electronic component and the heat sink is suppressed, resulting in a reduction in influence of heat of each of the first electronic component and the heat sink on the second electronic component.

Tenth, in the heat dissipation structure, it is desirable that an exhaust fan for discharging, to the outside of the outer casing, cooling air guided toward the second electronic component by the eaves portion be provided.

The exhaust fan for discharging, to the outside of the outer casing, cooling air guided toward the second electronic component by the eaves portion is provided, and therefore a convection current of the cooling air is forcibly generated inside the outer casing.

According to another embodiment of the present disclosure, there is provided an electronic apparatus including: an outer casing that has a chassis formed with at least one of air inlet holes for taking in cooling air from the outside; a circuit board that is disposed inside the outer casing, and in which a first electronic component which generates heat when driven and a second electronic component which does not generate heat when driven are mounted on one surface of a base plate; and a heat sink that is disposed on a surface side on which the first electronic component of the circuit board is mounted, and releases the heat generated in the first electronic component, wherein a gap is formed between the heat sink and the second electronic component, in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and at least one of the air inlet holes of the chassis is formed in a position facing the eaves portion.

Accordingly, in the electronic apparatus, the cooling air flowing-in from the air inlet hole is guided to the second electronic component by the eaves portion and the pair of enclosing portions.

A heat dissipation structure of an embodiment of the present disclosure includes: a circuit board that is disposed inside an outer casing having a chassis formed with at least one of air inlet holes for taking in cooling air from the outside is formed, and in which a first electronic component which generates heat when driven and a second electronic component which does not generate heat when driven are mounted on one surface of a base plate; and a heat sink that is disposed on a surface side on which the first electronic component of the circuit board is mounted, and releases the heat generated in the first electronic component, wherein a gap is formed between the heat sink and the second electronic component, in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and at least one of the air inlet holes of the chassis is formed in a position facing the eaves portion.

Accordingly, cooling air flowing-in from the air inlet hole may be guided between the heat sink and the circuit board by the eaves portion and the enclosing portions to thereby flow along the second electronic component, and therefore it is possible to suppress an increase in a temperature of the second electronic component without causing an increase in manufacturing costs and complexity of the structure.

In the technology described in the embodiment of the present disclosure, the chassis may be positioned so as to be spaced apart from the base plate while positioned so as to face the base plate, and a leading edge of the eaves portion may exist in the same position as a position of the base plate in a thickness direction of the base plate.

Accordingly, a flow rate of the cooling air flowing-in from the air inlet hole may be increased between the heat sink and the circuit board, thereby suppressing an increase in a temperature of the second electronic component.

In the technology described in the embodiment of the present disclosure, the chassis may be positioned so as to be spaced apart from the base plate while positioned so as to face the base plate, and a leading edge of the eaves portion may exist between the base plate and the chassis in a thickness direction of the base plate.

Accordingly, a flow rate of the cooling air flowing-in from the air inlet hole may be further increased between the heat sink and the circuit board, thereby further suppressing an increase in a temperature of the second electronic component.

In the technology described in the embodiment of the present disclosure, the chassis may be positioned so as to be spaced apart from the base plate while positioned so as to face the base plate, and a leading edge of the eaves portion may be brought into contact with the chassis.

Accordingly, a flow rate of the cooling air flowing-in from the air inlet hole may be still further increased between the heat sink and the circuit board, thereby still further suppressing an increase in a temperature of the second electronic component.

In the technology described in the embodiment of the present disclosure, the pair of enclosing portions may be positioned on the outside of the outer periphery of the base plate.

Accordingly, the cooling air flowing-in from the air inlet hole may be accurately guided to the eaves portion.

In the technology described in the embodiment of the present disclosure, a bending angle of the pair of enclosing portions with respect to the eaves portion may be less than 90°.

Accordingly, the cooling air guided to the eaves portion by the pair of enclosing portions may be increased, thereby suppressing an increase in a temperature of the second electronic component.

In the technology described in the embodiment of the present disclosure, a bending angle of the pair of enclosing portions with respect to the eaves portion may be 90°.

Accordingly, the cooling air may be accurately guided to the eaves portion by the pair of enclosing portions, thereby suppressing an increase in a temperature of the second electronic component.

In the technology described in the embodiment of the present disclosure, in the heat sink, a protrusion portion that protrudes to the circuit board side and is brought into contact with the first electronic component may be provided.

Accordingly, an increase in a temperature of the first electronic component may be suppressed, resulting in a reduction in influence of heat of the first electronic component on the second electronic component, thereby suppressing an increase in a temperature of the second electronic component.

In the technology described in the embodiment of the present disclosure, the chassis may be made of a material having favorable thermal conductivity, and the heat sink brought into contact with the chassis.

Accordingly, an increase in a temperature of each of the first electronic component and the heat sink is suppressed, resulting in a reduction in influence of heat of each of the first electronic component and the heat sink on the second electronic component, thereby suppressing an increase in a temperature of the second electronic component.

In the technology described in the embodiment of the present disclosure, an exhaust fan for discharging, to the outside of the outer casing, cooling air guided toward the second electronic component by the eaves portion may be provided.

Accordingly, a convection current of the cooling air is forcibly generated inside the outer casing, thereby further suppressing an increase in a temperature of the second electronic component.

An electronic apparatus of another embodiment of the present disclosure includes: an outer casing that has a chassis formed with at least one of air inlet holes for taking in cooling air from the outside is formed; a circuit board that is disposed inside the outer casing and in which a first electronic component which generates heat when driven and a second electronic component which does not generate heat when driven are mounted on one surface of a base plate; and a heat sink that is disposed on a surface side on which the first electronic component of the circuit board is mounted, and releases the heat generated in the first electronic component, wherein a gap is formed between the heat sink and the second electronic component, in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and at least one of the air inlet holes of the chassis is formed in a position facing the eaves portion.

Accordingly, cooling air flowing-in from the air inlet hole may be guided between the heat sink and the circuit board by the eaves portion and the pair of enclosing portions to thereby flow along the second electronic component, and therefore it is possible to suppress an increase in a temperature of the second electronic component without causing an increase in manufacturing costs and complexity of the structure.

DETAILED DESCRIPTION OF EMBODIMENTS

Hereinafter, preferred embodiments of a heat dissipation structure and an electronic apparatus according to the present disclosure will be described with reference to the accompanying drawings.

The following preferred embodiments relates to an electronic apparatus of the present disclosure which is applied to a disk recording and reproducing device, and a heat dissipation structure of the present disclosure which is applied to a heat dissipation structure provided in the disk recording and reproducing device.

In addition, an application range of the electronic apparatus and the heat dissipation structure according to the present disclosure is not limited to the disk recording and reproducing device and the heat dissipation structure provided in the disk recording and reproducing device. The electronic apparatus of the present disclosure may be widely applied to a variety of other electronic apparatuses such as a recording and reproducing device using a recording medium other than the disk recording and reproducing device, an information processing apparatus such as an audio recording and reproducing device, an imaging device, a network communication device, a personal computer, or Personal Digital Assistant (PDA), and the like. In addition, the heat dissipation structure of the present disclosure may be widely applied to a heat dissipation structure provided in the above-described variety of electronic apparatuses.

Configuration of Electronic Apparatus and Heat Dissipation Structure

Figure 1:
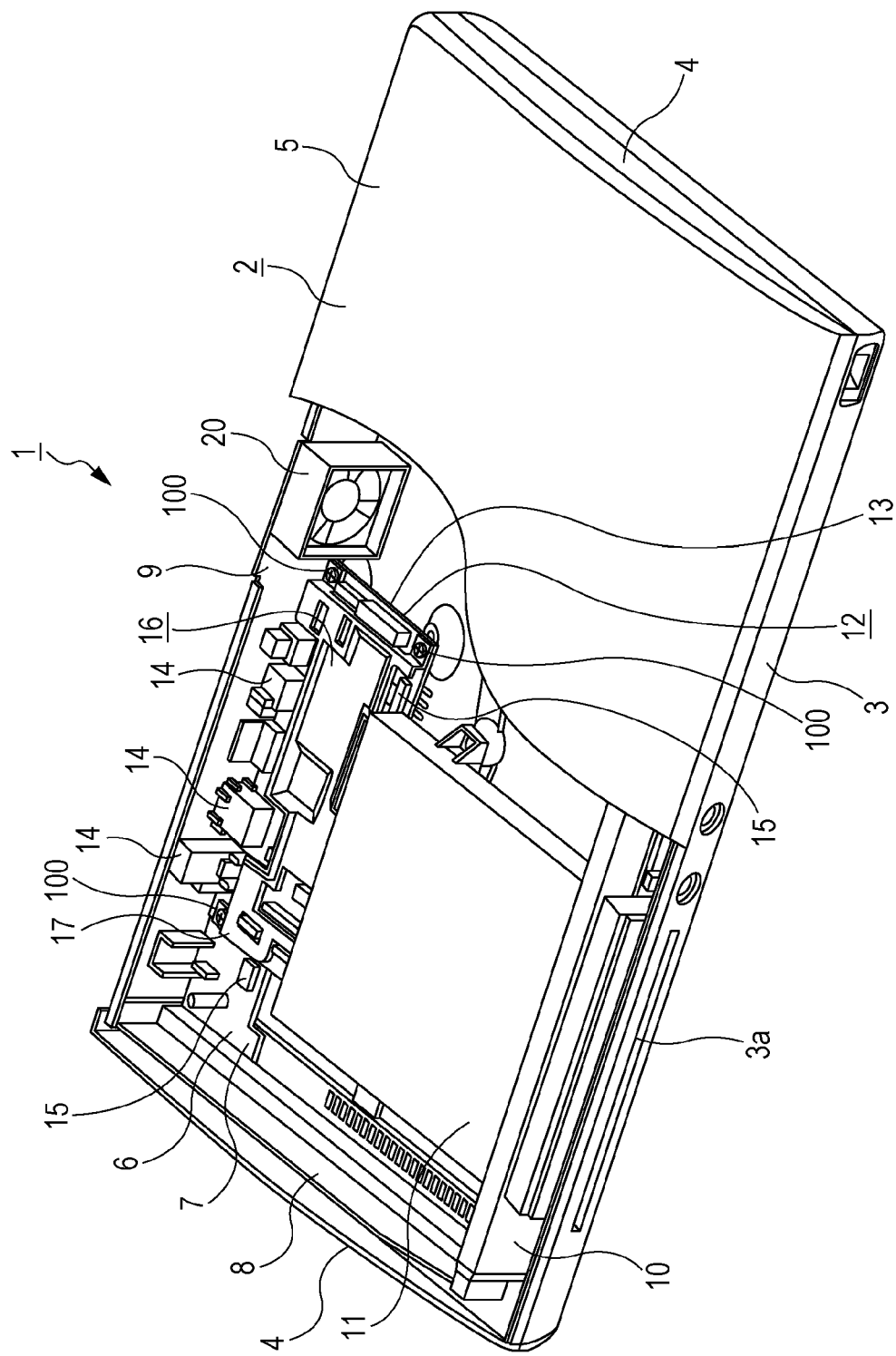
FIG. 1 is a drawing showing a preferred embodiment of a heat dissipation structure and an electronic apparatus of the present disclosure together with FIGS. 2 to 10, and a perspective view showing a part of the electronic apparatus which is cut.

In an electronic apparatus (disk recording and reproducing apparatus) 1, each of necessary components is disposed inside an outer casing 2, and the outer casing 2 includes a front panel 3, a side panel 4, 4 and a cover 5 (see, FIG. 1).

The front panel 3 is formed in a convex arcuate face-like horizontally long shape toward the substantially front oblique lower side. A disk insertion and removal hole 3a that laterally extends is formed on the front panel 3.

Side panels 4, 4 are positioned so as to be laterally spaced apart from each other, and a front end portion is respectively mounted on left and right end portions of the front panel 3.

The cover 5 is formed in a plate shape which faces in a substantially vertical direction, and blocks upwardly a space surrounded by the front panel 3 and the side panels 4, 4.

A chassis 6 is disposed inside the outer casing 2. The chassis 6 includes a horizontally long rectangular bottom surface portion 7 which faces in a vertical direction, side surface portions 8, 8 that protrude upwardly from left and right end portions of the bottom surface portion 7, and a rear surface portion 9 that protrudes upwardly from a rear end portion of the bottom surface portion 7. A horizontally long front base 10 is mounted on a front end portion of the chassis 6.

The chassis 6 is fixed to the outer casing 2 in such a manner that the front end portion of the bottom surface portion 7 is mounted on the rear end portion of the front panel 3 by screwing or the like, and the side surface portions 8, 8 are respectively mounted on the side panels 4, 4 by screwing or the like.

Figure 2:
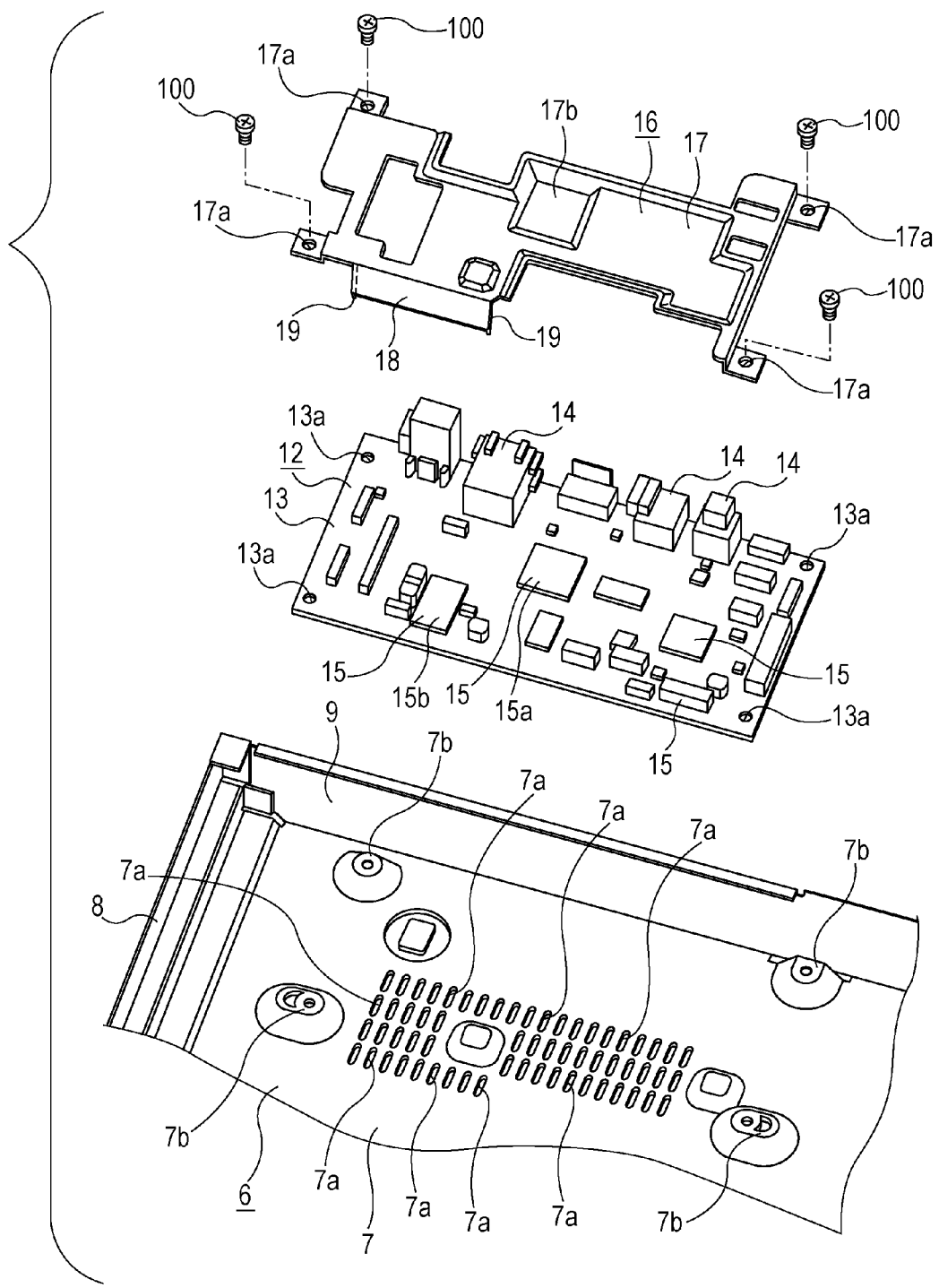
FIG. 2 is an enlarged exploded perspective view showing a heat dissipation structure.

On the bottom surface portion 7 of the chassis 6, a plurality of air inlet holes 7a, 7a, . . . are formed in a position near the rear end in a position near the left end (see, FIG. 2). On the bottom surface portion 7, embossed mounting protrusions 7b, 7b, . . . that upwardly protrude in the vicinity of the air inlet holes 7a, 7a, . . . are provided.

Figure 3:
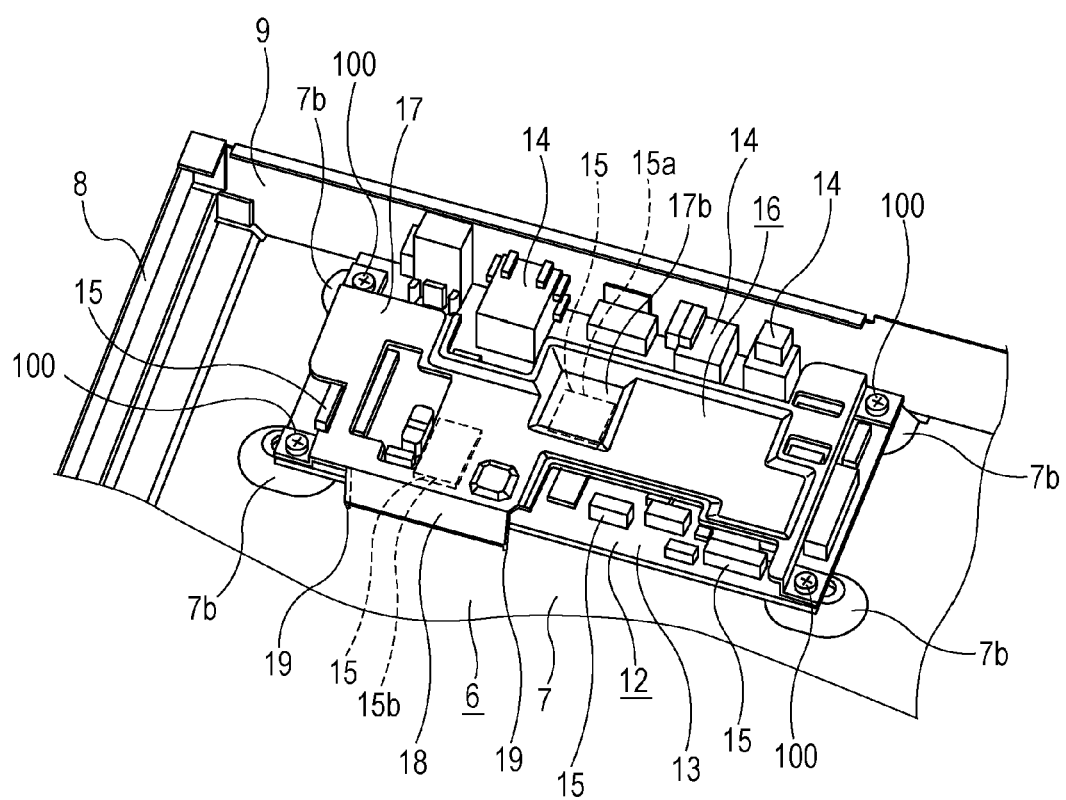
FIG. 3 is an enlarged perspective view showing a heat dissipation structure.

On the bottom surface portion 7 of the chassis 6, a power supply substrate which is not shown and an amplifier substrate are disposed in the right half part, and a disk drive unit 11 and a circuit board 12 (main substrate) are disposed side by side longitudinally in the left half part (see, FIGS. 1 to 3).

A front end portion of the disk drive unit 11 protrudes forward from the front base 10. A disk-shaped recording medium, which is not shown, inserted from the disk insertion and removal hole 3a formed on the front panel 3 is mounted on the disk drive unit 11, and recording or reproducing of an information signal is performed on the disk-shaped recording medium. The disk-shaped recording medium on which the recording or reproducing of the information signal has been performed is discharged from the disk insertion and removal hole 3a, and taken out to the outside.

The circuit board 12 includes a horizontally long rectangular base plate 13, connection components 14, 14, . . . such as a connector or the like mounted on the base plate 13, and electronic components 15, 15, . . . such as a chip or the like.

Insertion holes 13a, 13a, . . . are formed on four corners of the base plate 13.

The connection components 14, 14, . . . are disposed in a rear end portion of the base plate 13 so as to be laterally spaced apart from each other.

The electronic components 15, 15, . . . are respectively disposed in a predetermined position on both top and bottom surfaces of the base plate 13, and a first electronic component 15a that generates heat when driven and a second electronic component 15b that does not generate heat when driven are disposed on the top surface of the base plate 13. The first electronic component 15a is disposed in a substantially center portion of the base plate 13, and the second electronic component 15b is disposed in a position near the front end of the base plate 13.

A heat sink 16 is disposed on an upper side of the circuit board 12. The heat sink 16 is formed in such a manner that a heat dissipation unit 17 which faces in a substantially vertical direction, an eaves portion 18 which protrudes toward the front oblique lower side from a part of a front edge of the heat dissipation unit 17 and is formed in a horizontally long substantially rectangular shape, and a pair of enclosing portions 19, 19 which are respectively connected to left and right side edges of the eaves portion 18 and are bent to the lower side with respect to the eaves portion 18 are integrally formed. A bending angle of the enclosing portions 19, 19 with respect to the eaves portion 18 is, for example, 90°.

Screw insertion holes 17a, 17a, . . . are formed in four corners of the heat dissipation unit 17 (see, FIG. 2). An embossed protrusion portion 17b that protrudes to an upper side is provided in the heat dissipation unit 17, and is brought into contact with the first electronic component 15a through a heat transfer sheet which is not shown.

The circuit board 12 and the heat sink 16 are respectively mounted on the bottom surface portion 7 of the chassis 6 in such a manner that mounting screws 100, 100, . . . inserted into the insertion holes 13a, 13a, . . . of the base plate 13 and the screw insertion holes 17a, 17a, . . . of the heat dissipation unit 17 are screwed into the mounting protrusions 7b, 7b.

Figure 4:
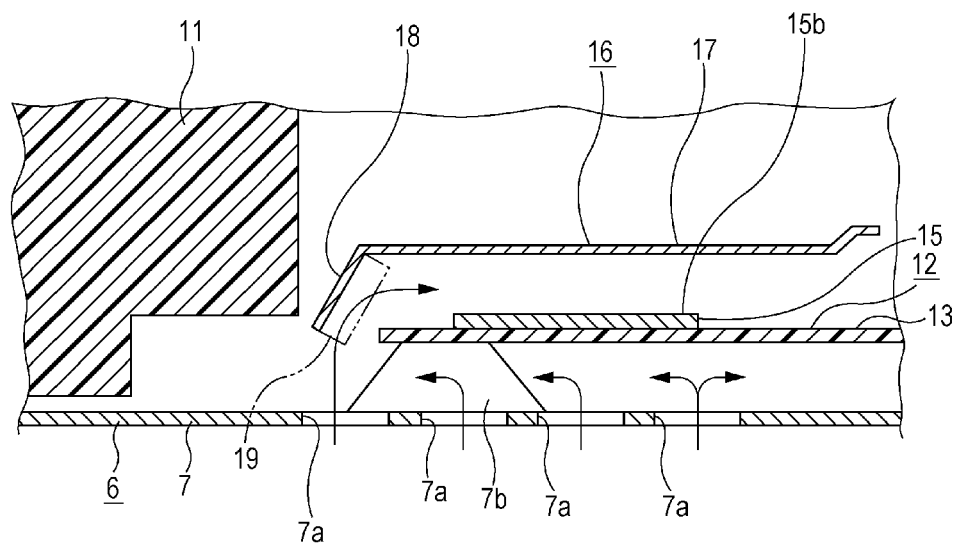
FIG. 4 is an enlarged cross-sectional view showing a heat dissipation structure.

In a state in which the heat sink 16 is mounted on the bottom surface portion 7, the eaves portion 18 and the enclosing portions 19, 19 are positioned on the outside of an outer periphery of the base plate 13 (see, FIGS. 3 and 4). The heat sink 16 is positioned so as to face the circuit board 12 in a state in which the protrusion portion 17b contacts the first electronic component 15a and a part other than the protrusion portion 17b of the heat dissipation unit 17 is spaced upwardly apart from the base plate 13. In addition, in the heat sink 16, the eaves portion 18 are positioned immediately in front of the second electronic component 15b, and a leading edge of the eaves portion 18 is positioned, for example, at the same height as that of the base plate 13 of the circuit board 12, and therefore a part of the air inlet holes 7a, 7a, . . . formed on the bottom surface portion 7 is positioned directly under the eaves portion 18.

An exhaust fan 20 for discharging air inside the outer casing 2 to the outside is mounted on a rear end portion of the bottom surface portion 7 of the chassis 6 (see, FIG. 1).

Operation of Electronic Apparatus

In the electronic apparatus 1 configured as above, the first electronic component 15a generates heat when the first electronic component 15a is driven. The heat generated in the first electronic component 15a is transferred to the heat sink 16 through the transfer sheet, and discharged from the heat sink 16. The heat discharged from the heat sink 16 is discharged from a gap existing in the electronic apparatus 1 to the outside, and forcibly discharged to the outside by the exhaust fan 20.

In addition, the heat generated in the first electronic component 15a is also transferred from the heat sink 16 to the chassis 6, and also discharged from the chassis 6.

Meanwhile, the heat generated when the first electronic component 15a is driven affects the second electronic component 15b which does not generate heat when driven, and therefore a temperature of the second electronic component 16b is increased. In this instance, cooling air is taken into the outer casing 2 from the air inlet holes 7a, 7a, . . . formed on the bottom surface portion 7 of the chassis 6, and the taken cooling air is guided between the heat dissipation unit 17 of the heat sink 16 and the base plate 13 of the circuit board 12 by the eaves portion 18 of the heat sink 16 and the enclosing portions 19, 19 (see, FIG. 4). In particular, the cooling air taken from the air inlet holes 7a, 7a, . . . positioned directly under the eaves portion 18 is guided between the heat dissipation unit 17 and the base plate 13 by the eaves portion 18 and the enclosing portions 19, 19.

Accordingly, the cooling air guided between the heat dissipation unit 17 and the base plate 13 flows along the second electronic component 15b, and therefore an increase in the temperature of the second electronic component 15b may be suppressed.

Bending Angle with Respect to Eaves Portion of Enclosing Portion

Figure 5:
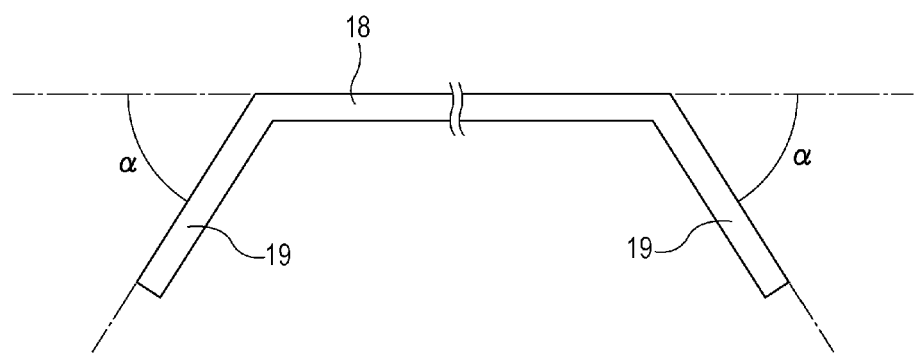
FIG. 5 is an enlarged front view showing a bending angle of an enclosing portion with respect to an eaves portion.

In the above, an example in which, in the heat sink 16, the enclosing portions 19, 19 are bent at 90° with respect to the eaves portion 18 has been described, but a bending angle of the enclosing portions 19, 19 with respect to the eaves portion 18 is not limited to 90°. The bending angle α of the enclosing portions 19, 19 with respect to the eaves portion 18 is arbitrarily determined as long as the bending angle is larger than 0° and smaller than 180°, as shown in FIG. 5, and in particular, it is preferable that the bending angle α be larger than 0° and equal to or smaller than 90°.

When the bending angle α of the enclosing portions 19, 19 with respect to the eaves portion 18 is smaller than 90°, the cooling air guided to the eaves portion 18 by the enclosing portions 19, 19 may be increased, and therefore the increase in the temperature of the second electronic component 15b may be suppressed.

In addition, when the bending angle α of the enclosing portions 19, 19 with respect to the eaves portion 18 is 90°, the cooling air may be reliably guided to the eaves portion 18 by the enclosing portions 19, 19, and therefore the increase in the temperature of the second electronic component 15b may be suppressed.

Measurement Result Relating to Heat Dissipation Performance

In the following, a measurement result relating to a heat dissipation performance with respect to the second electronic component 15b will be described (see, FIGS. 6 to 10).

In FIGS. 6 to 9, arrows indicate a flowing direction of cooling air flowing-in from the air inlet holes 7a, 7a, . . . of the chassis 6, and the number of arrows schematically shows a flow rate in the flowing direction. Accordingly, when the number of arrows is large, an amount of the cooling air flowing in the flowing direction is large, and when the number of arrows is small, the amount of the cooling air flowing in the flowing direction is small.

A measurement is performed by changing an amount of protrusion from the heat dissipation unit 17 of the eaves portion 18 of the heat sink 16 and an angle with respect to the heat dissipation unit 17, and is performed by measuring a temperature of a center of a surface of the second electronic component 15b under an environment of 45° C. A distance H between the base plate 13 of the circuit board 12 and the bottom surface portion 7 of the chassis 6 is 6.0 mm.

Figure 6:
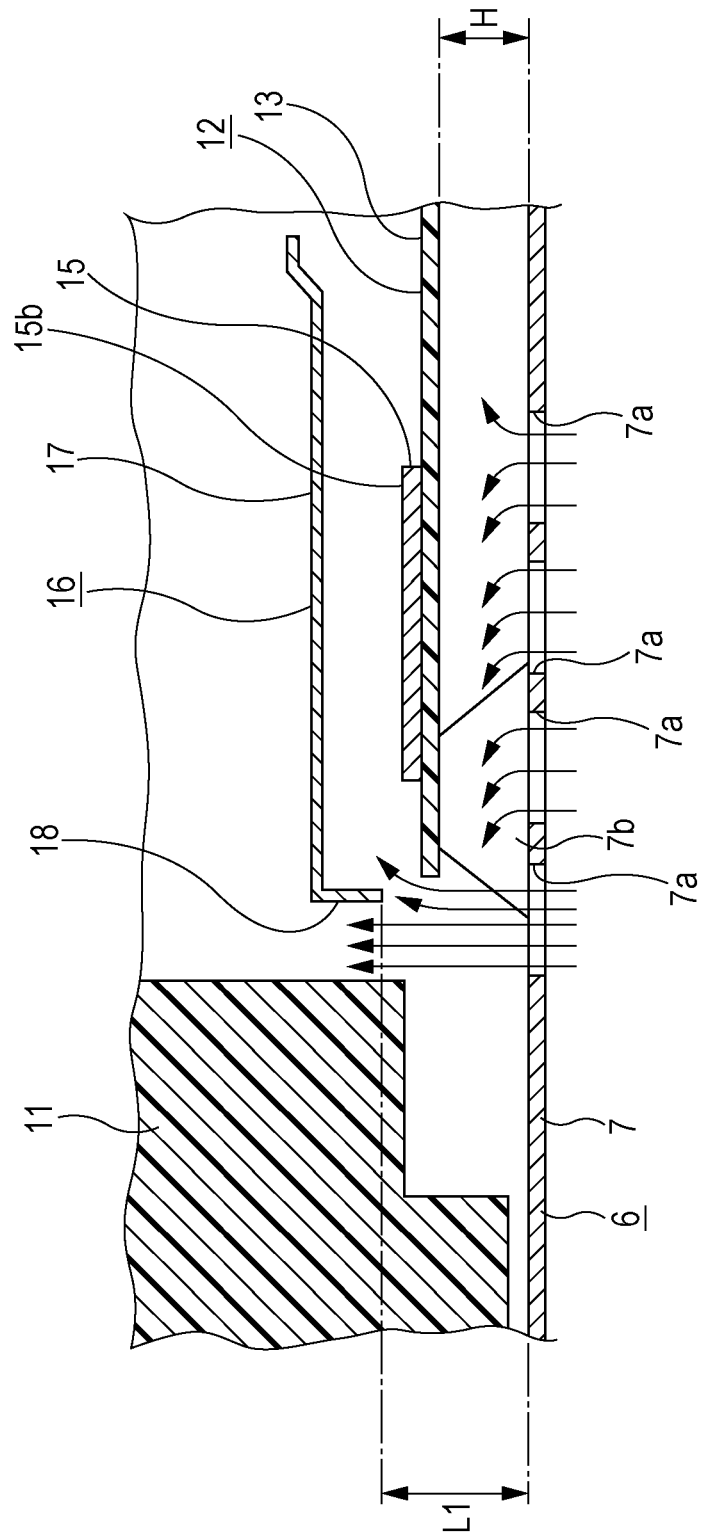
FIG. 6 is a drawing showing measurement results relating to a heat dissipation performance with respect to a second electronic component together with FIGS. 7 to 10, and an enlarged cross-sectional view showing a configuration of a measurement example.

In FIG. 6, a measurement example 1 in which an amount of protrusion from the heat dissipation unit 17 of the eaves portion 18 is 2.0 mm, and an angle of the eaves portion 18 with respect to the heat dissipation unit 17 is 90° is shown, and in the measurement example 1, the enclosing portions 19, 19 are not provided. In the measurement example 1, a distance L1 between a leading edge of the eaves portion 18 and the bottom surface portion 7 of the chassis 6 is 10.0 mm, and the leading edge of the eaves portion 18 is positioned on an upper side of the base plate 13 of the circuit board 12.

In the measurement example 1, a flow rate of the cooling air flowing-in from the air inlet holes 7a, 7a, . . . between the heat sink 16 and the circuit board 12 was small, and the temperature of the center of the surface of the second electronic component 15b under the environment of 45° C. was 69.1° C.

Figure 7:
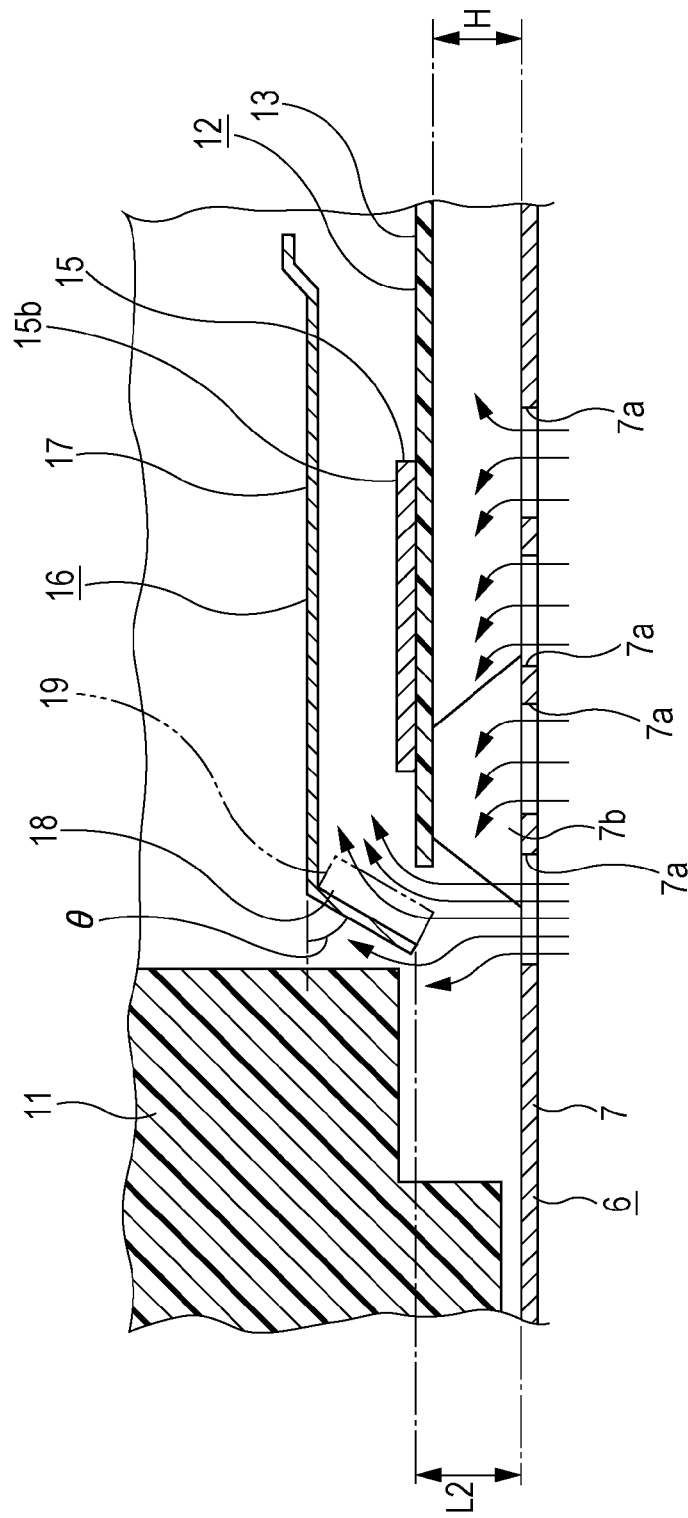
FIG. 7 is an enlarged cross-sectional view showing a configuration of a measurement example.

In FIG. 7, a measurement example 2 in which an amount of protrusion from the heat dissipation unit 17 of the eaves portion 18 is 3.8 mm, an angle θ of the eaves portion 18 with respect to the heat dissipation unit 17 is 60°, the enclosing portions 19, 19 are respectively connected to the entire left and right both side edges of the eaves portion 18 and provided so as to be bent at 90° with respect to the eaves portion 18, and a width from a bent portion of each of the enclosing portions 19, 19 to the leading edge is 2.4 mm is shown. In the measurement example 2, a distance L2 between the leading edge of the eaves portion 18 and the bottom surface portion 7 of the chassis 6 is 7.0 mm, and the leading edge of the eaves portion 18 is positioned at the same height as that of the base plate 13 of the circuit board 12.

In the measurement example 2, a flow rate of the cooling air flowing-in from the air inlet holes 7a, 7a, . . . between the heat sink 16 and the circuit board 12 was larger than that of the measurement example 1 of FIG. 6, and the temperature of the center of the surface of the second electronic component 15b under the environment of 45° C. was 66.8° C.

Figure 8:
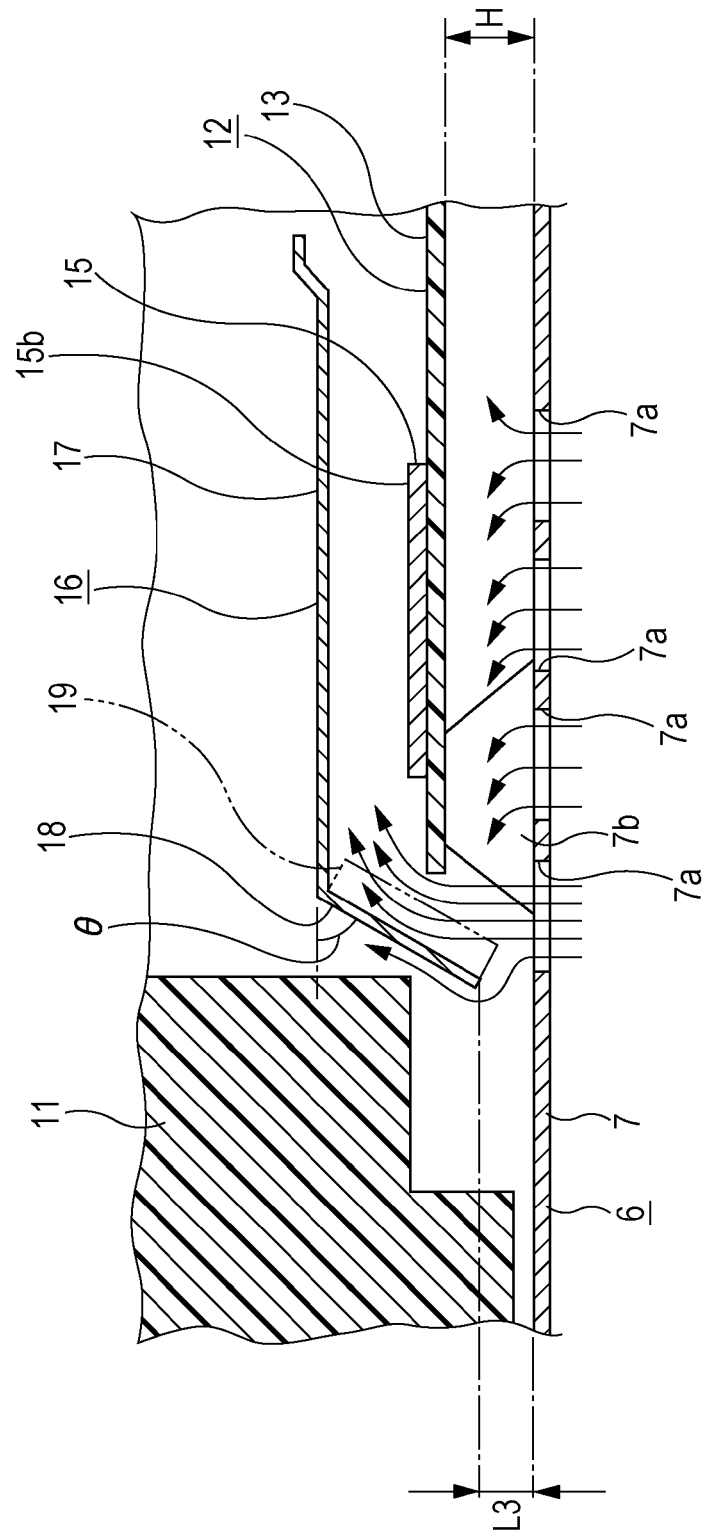
FIG. 8 is an enlarged cross-sectional view showing a configuration of a measurement example.

In FIG. 8, a measurement example 3 in which an amount of protrusion from the heat dissipation unit 17 of the eaves portion 18 is 9.0 mm, an angle θ of the eaves portion 18 with respect to the heat dissipation unit 17 is 60°, the enclosing portions 19, 19 are respectively connected to the entire left and right both side edges of the eaves portion 18 and provided so as to be bent at 90° with respect to the eaves portion 18, and a width from a bent portion of each of the enclosing portions 19, 19 to the leading edge is 2.4 mm is shown. In the measurement example 3, a distance L3 between the leading edge of the eaves portion 18 and the bottom surface portion 7 of the chassis 6 is 3.0 mm, and the leading edge of the eaves portion 18 is positioned between the base plate 13 of the circuit board 12 and the bottom surface portion 7.

In the measurement example 3, a flow rate of the cooling air flowing-in from the air inlet holes 7a, 7a, ... between the heat sink 16 and the circuit board 12 was larger than that of the measurement example 2 of FIG. 7, and the temperature of the center of the surface of the second electronic component 15b under the environment of 45° C. was 64.4° C.

Figure 9:
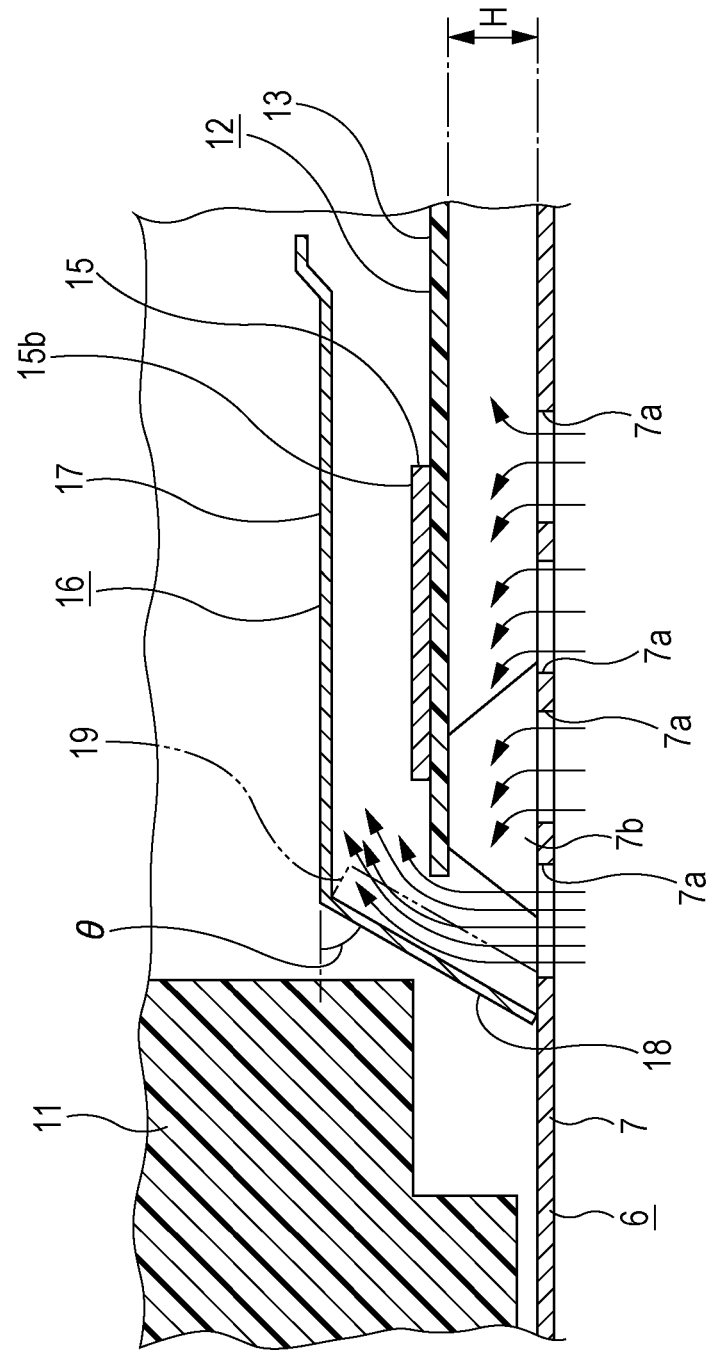
FIG. 9 is an enlarged cross-sectional view showing a configuration of a measurement example.

In FIG. 9, a measurement example 4 in which an amount of protrusion from the heat dissipation unit 17 of the eaves portion 18 is 13.0 mm, an angle θ of the eaves portion 18 with respect to the heat dissipation unit 17 is 60°, the enclosing portions 19, 19 are respectively connected to the entire left and right side edges of the eaves portion 18 and provided so as to be bent at 90° with respect to the eaves portion 18, and a width from a bent portion of each of the enclosing portions 19, 19 to the leading edge is 2.4 mm is shown. In the measurement example 4, the leading edge of the eaves portion 18 contacts the bottom surface portion 7 of the chassis 6.

In the measurement example 4, a flow rate of the cooling air flowing-in from the air inlet holes 7a, 7a, ... between the heat sink 16 and the circuit board 12 was larger than that of the measurement example 3 of FIG. 8, and the temperature of the center of the surface of the second electronic component 15b under the environment of 45° C. was 64.1° C.

Figure 10:
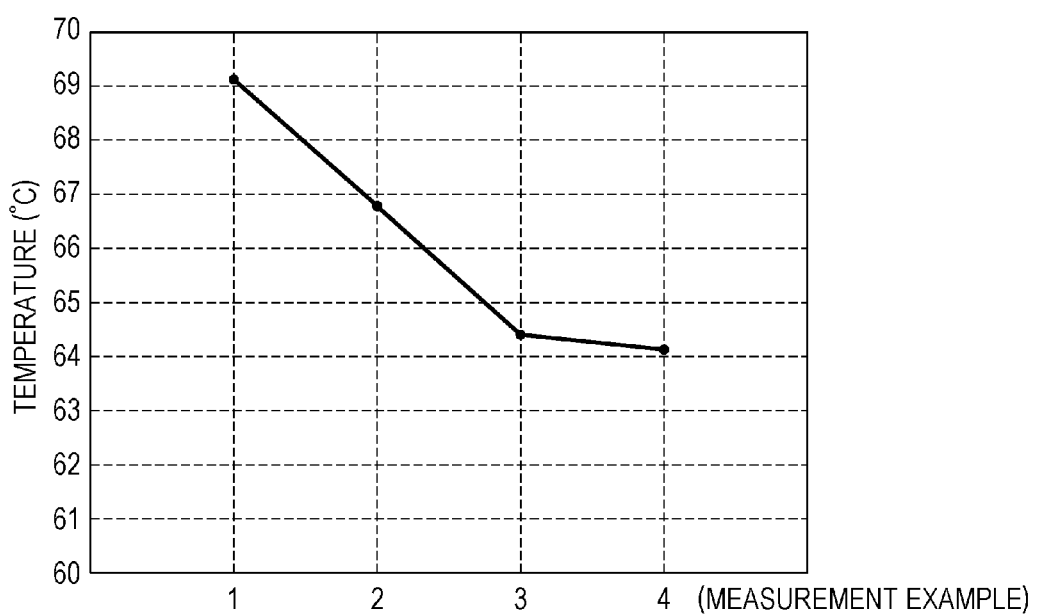
FIG. 10 is a graph showing a surface temperature of a second electronic component.

FIG. 10 is a graph showing of a temperature of a center of the surface of the second electronic component 15b measured in the measurement examples 1 to 4 of FIGS. 6 to 9.

From measurement results of FIG. 10, it can be confirmed that the eaves portion 18 and the enclosing portions 19, 19 are provided in the heat sink 16, and the air inlet holes 7a, 7a, ... are formed directly under the eaves portion 18, and therefore the increase in the temperature of the second electronic component 15b is sufficiently suppressed.

With regard to the second electronic component 15b, a temperature of 65° C. or less may be preferable in order to prevent the shortening of the life by ensuring a normal operation, and excellent results was obtained particularly in the measurement examples 3 and 4.

In addition, it can be confirmed that the leading edge of the eaves portion 18 is positioned at the same height as that of the base plate 13 of the circuit board 12, and therefore a flow rate of the cooling air flowing-in from the air inlet holes 7a, 7a, ... between the heat sink 16 and the circuit board 12 becomes larger, thereby suppressing the increase in the temperature of the second electronic component 15b.

Further, it can be confirmed that the leading edge of the eaves portion 18 is positioned between the base plate 13 of the circuit board 12 and the bottom surface portion 7, and therefore the flow rate of the cooling air flowing-in from the air inlet holes 7a, 7a, ... between the heat sink 16 and the circuit board 12 becomes further larger, thereby further suppressing the increase in the temperature of the second electronic component 15b.

Still further, it can be confirmed that the leading edge of the eaves portion 18 is brought into contact with the bottom surface portion 7 of the chassis 6, and therefore the flow rate of the cooling air flowing-in from the air inlet holes 7a, 7a, ... between the heat sink 16 and the circuit board 12 becomes still further larger, thereby still further suppressing the increase in the temperature of the second electronic component 15b.

Overview

As described above, in the electronic apparatus 1, the eaves portion 18 and the enclosing portions 19, 19 are provided in the heat sink 16, and the air inlet holes 7a, 7a, ... of the chassis 6 is formed in a position which faces the eaves portion 18.

Accordingly, the cooling air flowing-in from the air inlet holes 7a, 7a, ... is guided between the heat sink 16 and the circuit board 12 by the eaves portion 18 and the enclosing portions 19, 19, and flows along the second electronic component 15b, and therefore the increase in the temperature of the second electronic component 15b may be suppressed.

In addition, the eaves portion 18 and the enclosing portions 19, 19 are provided as a part of the heat sink 16, and therefore the number of components is not increased, and the increase in the temperature of the second electronic component 15b may be suppressed without causing an increase in manufacturing costs and complexity of the structure.

In addition, the enclosing portions 19, 19 are positioned on the outside of the circuit board 12, and therefore the cooling air flowing-in from the air inlet holes 7a, 7a, ... may be reliably guided to the eaves portion 18.

Further, the protrusion portion 17b that contacts the first electronic component 15a is provided in the heat sink 16, and therefore an increase in a temperature of the first electronic component 15a may be suppressed, and influence of the heat of the first electronic component 15a on the second electronic component 15b may be reduced, thereby suppressing the increase in the temperature of the second electronic component 15b.

Still further, the heat sink 16 contacts the chassis 6, and therefore an increase in a temperature of each of the first electronic component 15a and the heat sink 16 may be suppressed, and influences of the heat of the first electronic component 15a and the heat sink 16 on the second electronic component 15b may be reduced, thereby suppressing the increase in the temperature of the second electronic component 15b.

In addition, the exhaust fan 20 for discharging, to the outside of the outer casing 2, the cooling air guided toward the second electronic component 15b by the eaves portion 18 is provided, and therefore a convection current of the cooling air is forcibly generated inside the outer casing 2, thereby further suppressing the increase in the temperature of the second electronic component 15b.

Present Technology

The present technology may be configured as follows.

(1) A heat dissipation structure including: a circuit board that is disposed inside an outer casing having a chassis formed with at least one of air inlet holes for taking in cooling air from the outside, and in which a first electronic component which generates heat when driven and a second electronic component which does not generate heat when driven are mounted on one surface of a base plate; and a heat sink that is disposed on a surface side on which the first electronic component of the circuit board is mounted, and releases the heat generated in the first electronic component, wherein a gap is formed between the heat sink and the second electronic component, in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and at least one of the air inlet holes of the chassis is formed in a position facing the eaves portion.

(2) The heat dissipation structure described in (1), in which the chassis is positioned so as to be spaced apart from the base plate while positioned so as to face the base plate, and a leading edge of the eaves portion exists in the same position as a position of the base plate in a thickness direction of the base plate.

(3) The heat dissipation structure described in (1), in which the chassis is positioned so as to be spaced apart from the base plate while positioned so as to face the base plate, and a leading edge of the eaves portion exists between the base plate and the chassis in a thickness direction of the base plate.

(4) The heat dissipation structure described in (1), in which the chassis is positioned so as to be spaced apart from the base plate while positioned so as to face the base plate, and a leading edge of the eaves portion is brought into contact with the chassis.

(5) The heat dissipation structure described in any one of (1) to (4), in which the pair of enclosing portions are positioned on the outside of the outer periphery of the base plate.

(6) The heat dissipation structure described in any one of (1) to (5), in which a bending angle of the pair of enclosing portions with respect to the eaves portion is less than 90°.

(7) The heat dissipation structure described in any one of (1) to (5), in which a bending angle of the pair of enclosing portions with respect to the eaves portion is 90°.

(8) The heat dissipation structure described in any one of (1) to (7), in which, in the heat sink, a protrusion portion that protrudes to the circuit board side and is brought into contact with the first electronic component is provided.

(9) The heat dissipation structure described in any one of (1) to (8), in which the chassis is made of a material having favorable thermal conductivity, and the heat sink is brought into contact with the chassis.

(10) The heat dissipation structure described in any one of (1) to (9), in which an exhaust fan for discharging, to the outside of the outer casing, cooling air guided toward the second electronic component by the eaves portion is provided.

(11) An electronic apparatus including: an outer casing that has a chassis formed with at least one of air inlet holes for taking in cooling air from the outside; a circuit board that is disposed inside the outer casing, and in which a first electronic component which generates heat when driven and a second electronic component which does not generate heat when driven are mounted on one surface of a base plate; and a heat sink that is disposed on a surface side on which the first electronic component of the circuit board is mounted, and releases the heat generated in the first electronic component, wherein a gap is formed between the heat sink and the second electronic component, in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and at least one of the air inlet holes of the chassis is formed in a position facing the eaves portion.

Specific shapes and structures of each component shown in the above-described preferred embodiments are merely an example of materialization when implementing the present disclosure, and the technical scope of the present disclosure should not be thereby restrictively interpreted.

What is claimed is:

1. A heat dissipation structure comprising:
   a circuit board that is disposed inside an outer casing having a chassis formed with at least one of air inlet holes for taking in cooling air from the outside, and in which a first electronic component which generates heat when driven and a second electronic component which does not generate heat when driven are mounted on one surface of a base plate; and
   a heat sink that is disposed on a surface side on which the first electronic component of the circuit board is mounted, and releases the heat generated in the first electronic component,
   wherein a gap is formed between the heat sink and the second electronic component,
   in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and
   at least one of the air inlet holes of the chassis is formed in a position facing the eaves portion.

2. The heat dissipation structure according to claim 1, wherein the chassis is positioned so as to be spaced apart from the base plate while positioned so as to face the base plate, and
   a leading edge of the eaves portion exists in the same position as a position of the base plate in a thickness direction of the base plate.

3. The heat dissipation structure according to claim 1, wherein the chassis is positioned so as to be spaced apart from the base plate while positioned so as to face the base plate, and
   a leading edge of the eaves portion exists between the base plate and the chassis in a thickness direction of the base plate.

4. The heat dissipation structure according to claim 1, wherein the chassis is positioned so as to be spaced apart from the base plate while positioned so as to face the base plate, and
   a leading edge of the eaves portion is brought into contact with the chassis.

5. The heat dissipation structure according to claim 1, wherein the pair of enclosing portions are positioned on the outside of the outer periphery of the base plate.

6. The heat dissipation structure according to claim 1, wherein a bending angle of the pair of enclosing portions with respect to the eaves portion is less than 90°.

7. The heat dissipation structure according to claim 1, wherein a bending angle of the pair of enclosing portions with respect to the eaves portion is 90°.

8. The heat dissipation structure according to claim 1, wherein, in the heat sink, a protrusion portion that protrudes to the circuit board side and is brought into contact with the first electronic component is provided.

9. The heat dissipation structure according to claim 1, wherein the chassis is made of a material having favorable thermal conductivity, and
the heat sink is brought into contact with the chassis.

10. The heat dissipation structure according to claim 1, wherein an exhaust fan for discharging, to the outside of the outer casing, cooling air guided toward the second electronic component by the eaves portion is provided.

11. An electronic apparatus comprising:
an outer casing that has a chassis formed with at least one of air inlet holes for taking in cooling air from the outside;
a circuit board that is disposed inside the outer casing, and in which a first electronic component which generates heat when driven and a second electronic component which does not generate heat when driven are mounted on one surface of a base plate; and
a heat sink that is disposed on a surface side on which the first electronic component of the circuit board is mounted, and releases the heat generated in the first electronic component,
wherein a gap is formed between the heat sink and the second electronic component,
in the heat sink, a heat dissipation unit that is positioned so as to face the base plate of the circuit board, an eaves portion that protrudes from the heat dissipation unit to be positioned on the outside of an outer periphery of the base plate and guides, to the second electronic component, the cooling air flowing into the outer casing from the air inlet hole, and a pair of enclosing portions that respectively protrude from both ends of the eaves portion in a direction perpendicular to a protruding direction from the heat dissipation unit and are bent to the circuit board side with respect to the eaves portion are provided, and
at least one of the air inlet holes of the chassis is formed in a position facing the eaves portion.

* * * * *